United States Patent
Böffgen et al.

(10) Patent No.: US 9,236,865 B2
(45) Date of Patent: Jan. 12, 2016

(54) APPARATUS AND METHOD FOR GENERATING RANDOM BITS

(71) Applicants: Pascale Böffgen, München (DE); Markus Dichtl, München (DE)

(72) Inventors: Pascale Böffgen, München (DE); Markus Dichtl, München (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 14/268,747

(22) Filed: May 2, 2014

(65) Prior Publication Data

US 2014/0354327 A1    Dec. 4, 2014

(30) Foreign Application Priority Data

May 3, 2013  (DE) .......................... 10 2013 208 154

(51) Int. Cl.
| | |
|---|---|
| G06F 7/38 | (2006.01) |
| H03K 19/173 | (2006.01) |
| H03K 17/16 | (2006.01) |
| H03K 19/003 | (2006.01) |
| G06F 7/58 | (2006.01) |
| H03K 19/00 | (2006.01) |

(52) U.S. Cl.
CPC .......... H03K 19/00346 (2013.01); G06F 7/588 (2013.01); H03K 19/0008 (2013.01)

(58) Field of Classification Search
CPC ......... H04H 9/0869; G06F 7/588; G06F 7/58; H03K 3/84
See application file for complete search history.

(56) References Cited

U.S. PATENT DOCUMENTS

| | | | |
|---|---|---|---|
| 7,904,776 B2 | 3/2011 | Ichiyama et al. | |
| 2001/0003530 A1 | 6/2001 | Sriram et al. | |
| 2003/0053625 A1* | 3/2003 | Bially et al. | .................... 380/42 |
| 2009/0189667 A1 | 7/2009 | Ichiyama et al. | |
| 2011/0040817 A1 | 2/2011 | Lazich et al. | |
| 2012/0293354 A1 | 11/2012 | Suzuki | |
| 2013/0036078 A9 | 2/2013 | Wilber | |

FOREIGN PATENT DOCUMENTS

| | | |
|---|---|---|
| DE | 102008003946 A1 | 7/2009 |
| DE | 102009007482 A1 | 10/2009 |

OTHER PUBLICATIONS

European Search report for 14163797.5, mailed Jul. 1, 2014, with English Translation.

(Continued)

*Primary Examiner* — Jany Richardson
(74) *Attorney, Agent, or Firm* — Lempia Summerfield Katz LLC

(57) ABSTRACT

An apparatus for generating random bits includes a plurality of mapping devices. A respective mapping device is configured to map a predefined number of input signals, with the aid of a combinatorial mapping, into a predefined number of output signals. The plurality of mapping devices are concatenated with one another, and at least one combinatorial mapping is configured such that a state change of an input signal of a respective mapping device is mapped on average onto more than one output signal of the respective mapping device. No feedback loop is present such that a state change of at least one feedback output signal of a specific mapping device is fed as a state change of at least one input signal to another mapping device such that one or a plurality of output signals of the specific mapping device is influenced by the state change of the feedback output signal.

20 Claims, 7 Drawing Sheets

(56) References Cited

OTHER PUBLICATIONS

Fischer V. et al: Project ANR—ICTeR True Random Number Generators in Configurable Logic Devices Version 1.02; URL:http://www.lirmm.fri/~w3mic/ANR/PDF/D2.pdf; XP055102465; Feb. 12, 2009.

German Office Action for German Application No. 10 2013 208 154.5, mailed Jan. 9, 2014, with English Translation.
Majzoobi M. et al: FPGA-Based True Random Number Generation Using Circuit Metastability with Adaptive Feedback Control; Cryptographic hardware and embedded systems A ches 2011, Springer Berlin Heidelberg; pp. 17-32; ISBN: 978-3-642-23950-2; XP019166873; Sep. 28, 2011.

* cited by examiner

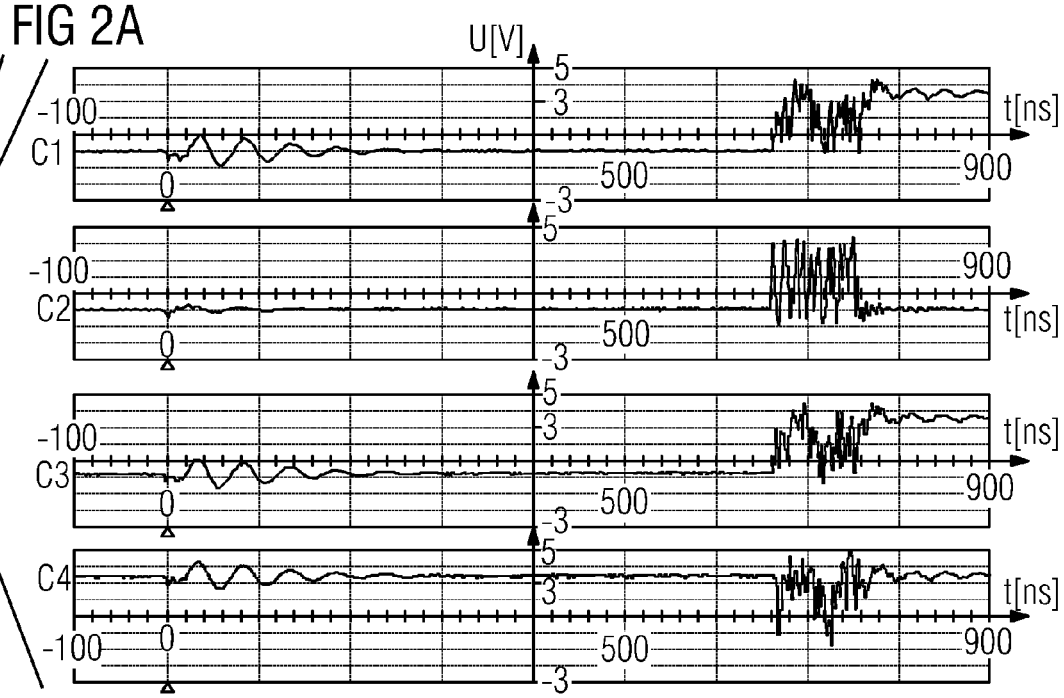
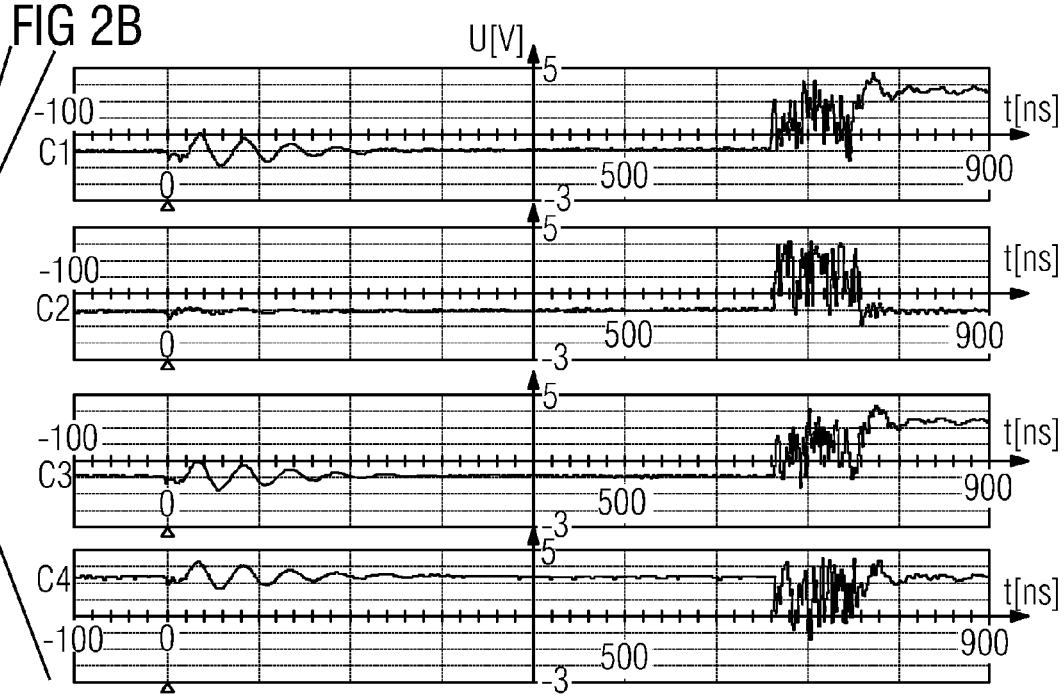

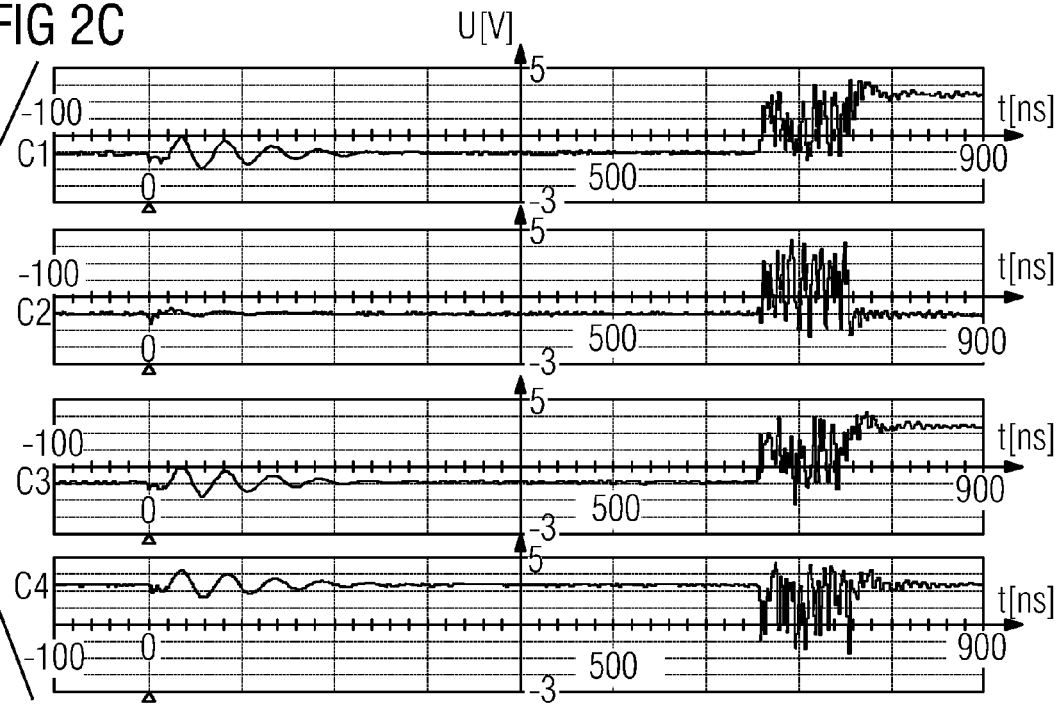
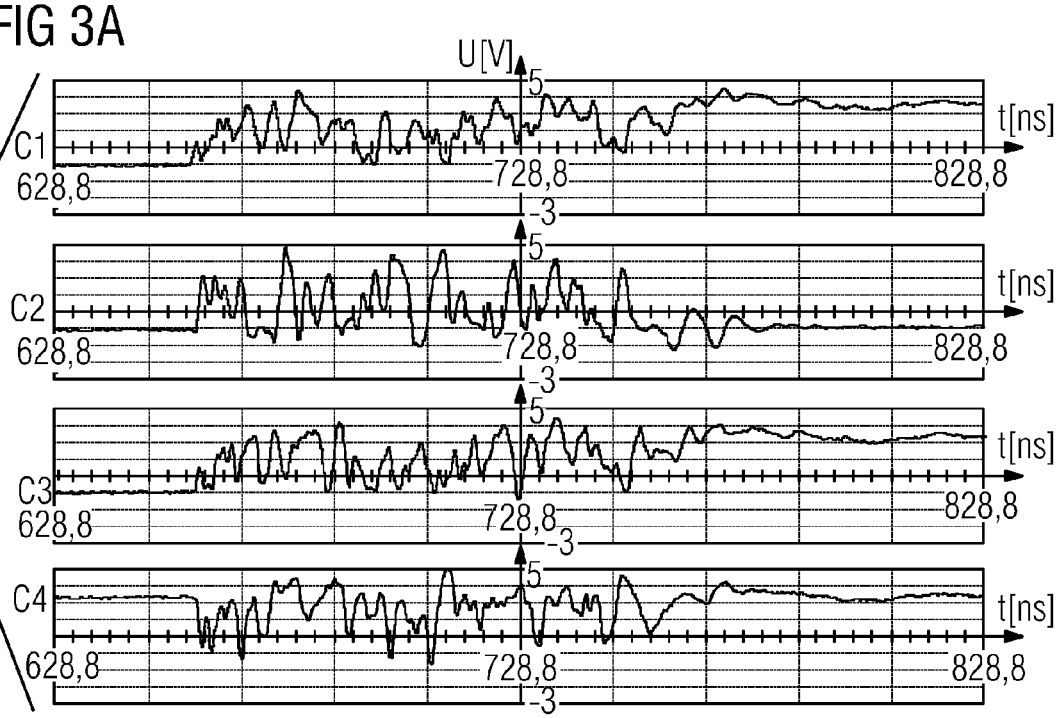

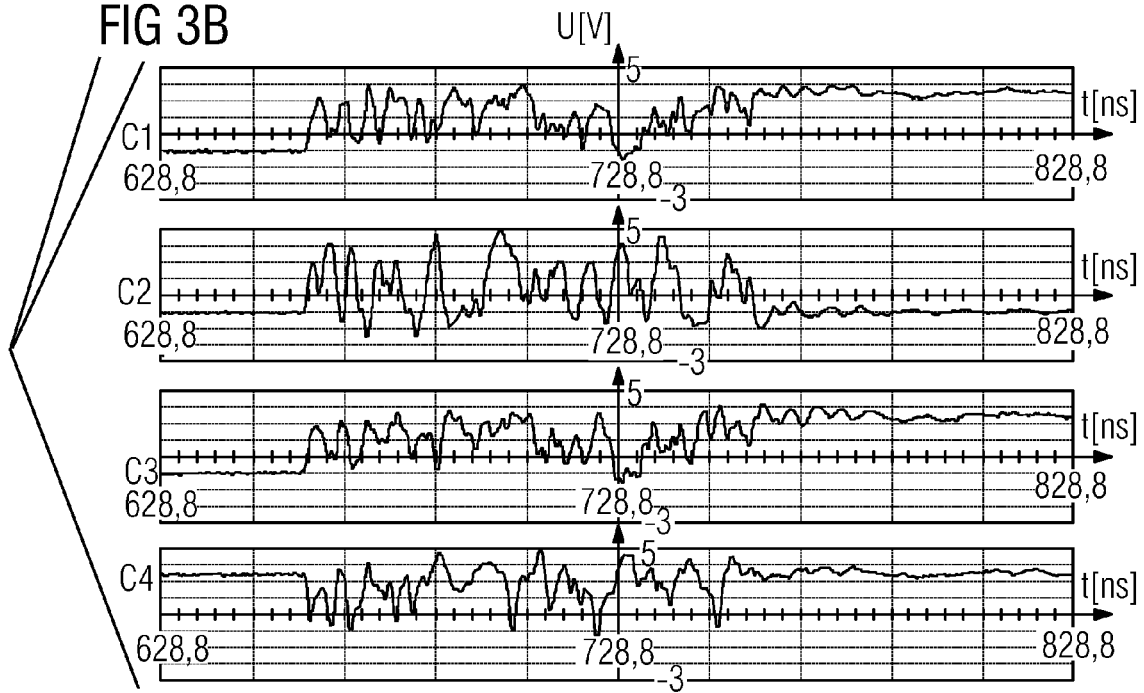
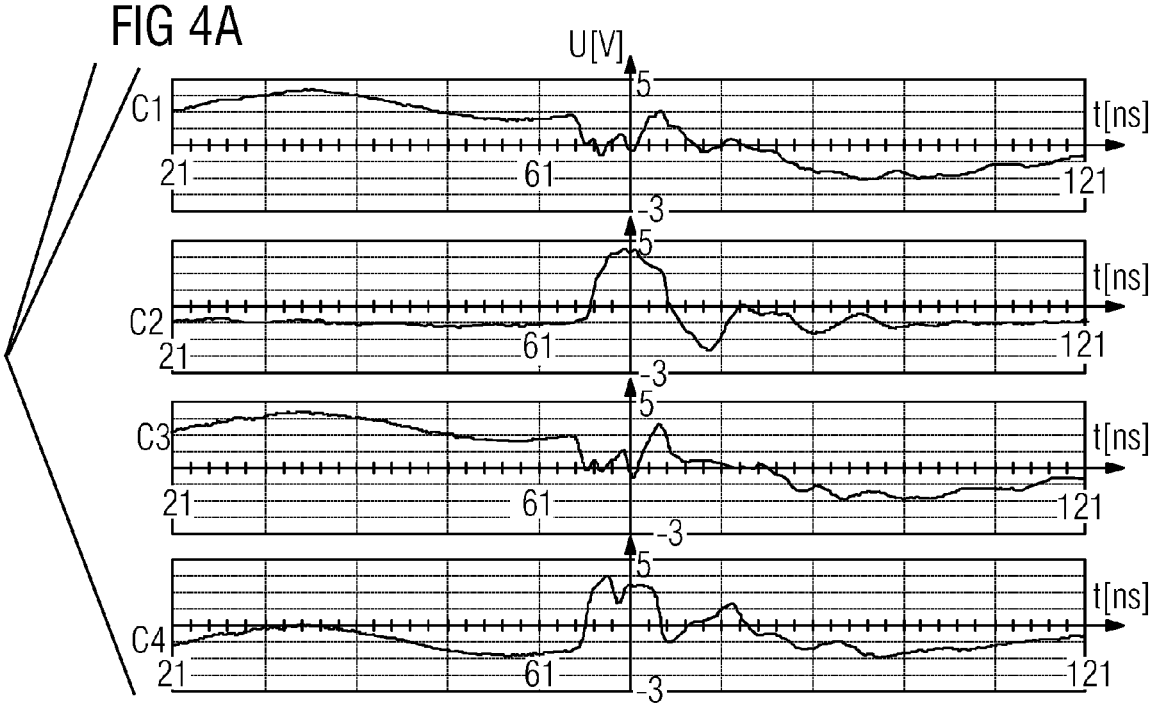

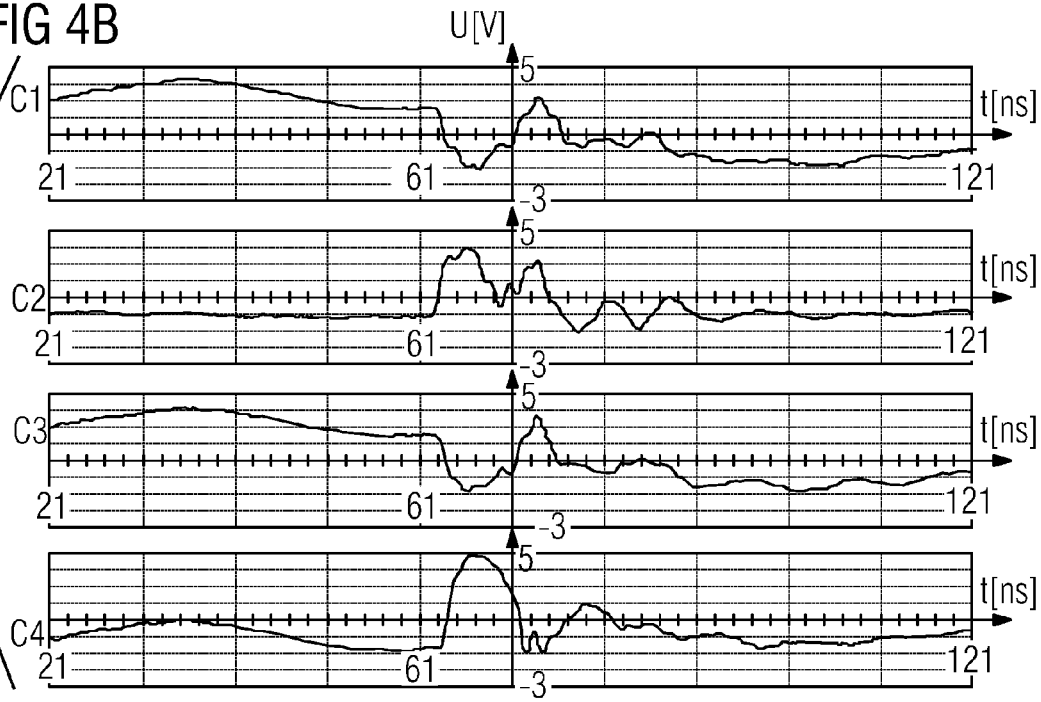
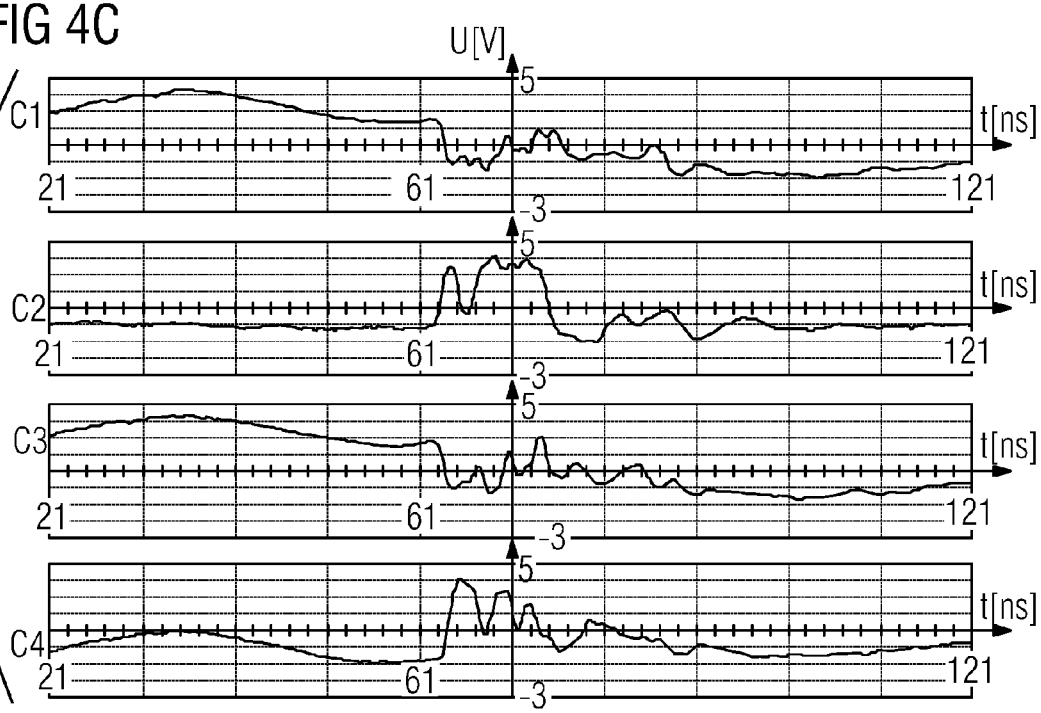

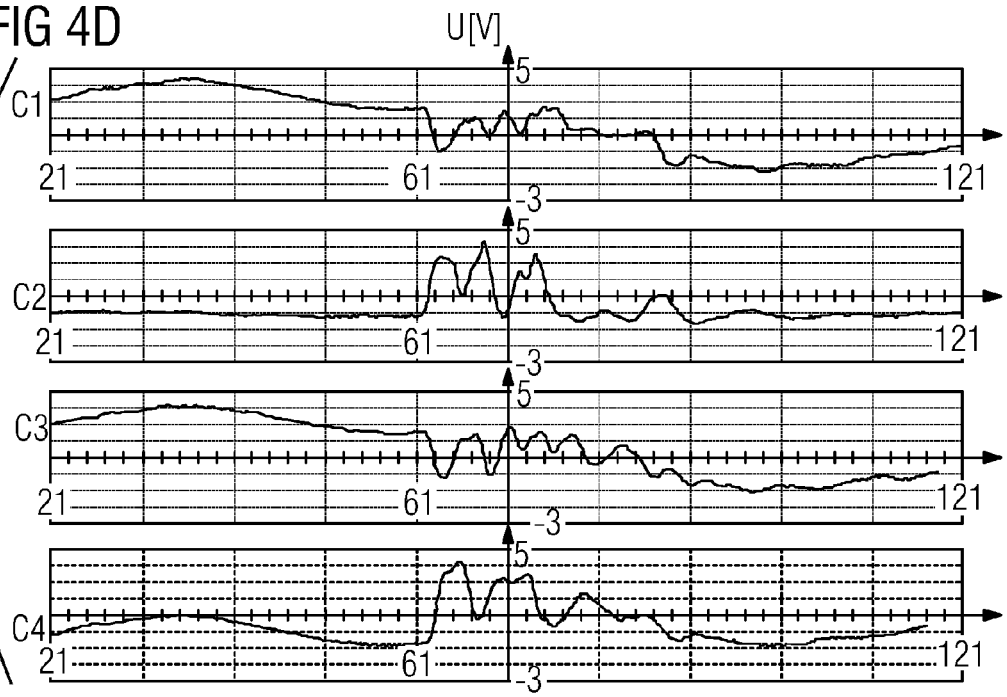
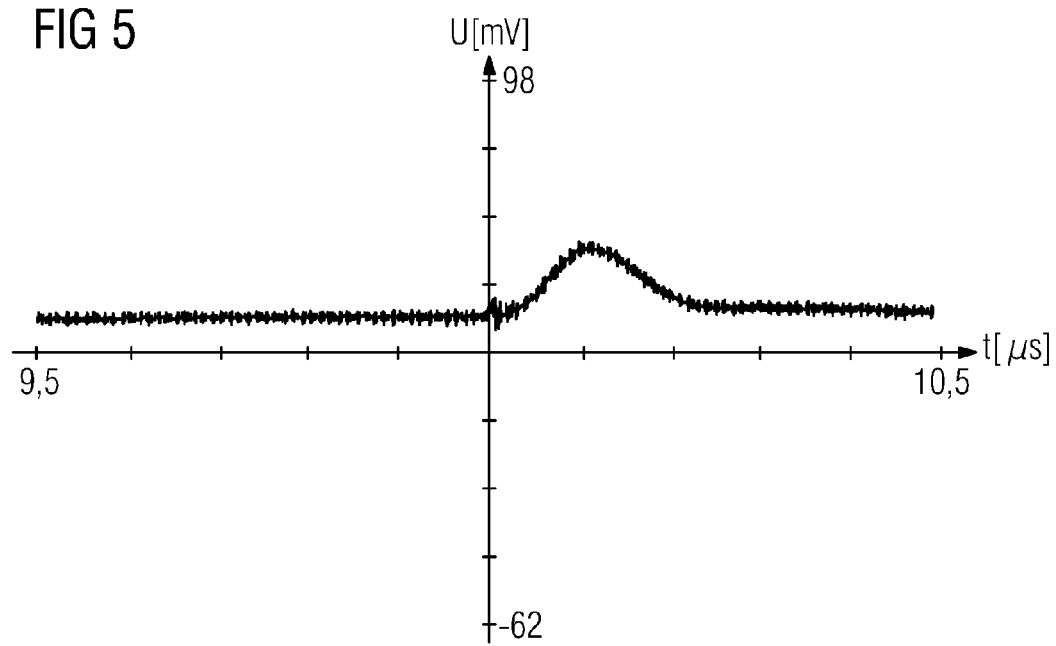

APPARATUS AND METHOD FOR GENERATING RANDOM BITS

This application claims the benefit of DE 10 2013 208 154.5, filed on May 3, 2013, which is hereby incorporated by reference in its entirety.

BACKGROUND

The present embodiments relate to generating one or more random bits.

In security-relevant applications (e.g., in asymmetrical authentication methods), random bit sequences are used as binary random numbers. In this case, it is desired to implement as little hardware outlay as possible, particularly in mobile applications. Known measures for generating random numbers include, for example, pseudo-random number generators, analog random sources, ring oscillators and modifications thereof.

In pseudo-random number generators, seeds are used. Proceeding from this, deterministic pseudo-random numbers are calculated. A physical random generator may be used for generating the seed. As analog random sources, noise sources such as, for example, the noise of zener diodes are amplified and digitized. In this case, the linking of digital with analog circuit technology may be realized only in a complex fashion.

In the case of ring oscillators constructed from an odd number of inverters connected in series, random jitter arises from fluctuating transient times of the signals through the inverters. The jitter (e.g., an irregular temporal fluctuation in state changes of the signals sent through the inverters) may be accumulated upon multiple passes through the ring oscillator circuit, such that ultimately a random analog signal arises. What is often disadvantageous in the case of ring oscillators is the long time required from the start of the oscillation until a usably random signal arises on account of the accumulation of jitter. Therefore, low, unacceptable data generation rates may arise in the case of ring oscillators. The accumulating jitter contributions may also cancel themselves out again, such that on average, random short gate transient times are compensated for by random longer gate transient times.

Fibonacci and Galois ring oscillators generate random signal waveforms more rapidly than traditional ring oscillators. However, different digital gates such as XOR and NOT gates are used. As a result, large differences in the speed of the types of gates may arise (e.g., in implementations on ASICs). It is often desired to generate random bit sequences with the aid of field programmable gate arrays (FPGAs). However, in these digital components, periodic oscillations that have only low entropy or randomness in the signals may commence (e.g., on account of ambient temperature fluctuations).

The power consumption in oscillator circuits in random number generators may prove to be disadvantageous, since an electric current is to continuously flow during operation.

In digital circuits, the current consumption essentially depends on the number of changeover processes per time. In corresponding digital oscillation circuits, this is to take place continuously, and a rather unfavorable power consumption arises in the case of random number generators based on ring oscillators. In the case of mobile applications, it is desirable to keep down the power consumption or the current consumption of the circuits implemented in terms of hardware. Nevertheless, statistically good physical random chance is intended to arise.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an improved apparatus and/or a method for generating random bits is provided.

In one embodiment, an apparatus for generating random bits includes a plurality of mapping devices concatenated with one another. A respective mapping device is configured to map a predefined number n of input signals with the aid of a combinatorial mapping into a predefined number p of output signals. At least one combinatorial mapping is configured such that a state change of an input signal of a respective mapping device is mapped on average onto more than one output signal of the respective mapping device. In this case, no feedback loop is present such that a state change of at least one feedback output signal of a specific mapping device is fed as a state change of at least one input signal to another mapping device such that one or a plurality of output signals of the specific mapping device is influenced by the state change of the feedback output signal.

In one embodiment, the mapping devices are concatenated with one another such that no feedback arises. This has the consequence that the apparatus does not have to continuously perform changeover processes in an implementation as a digital circuit, which limits the current consumption.

The apparatus develops no "oscillations" (e.g., signal changes do not propagate in circulation). By way of example, the output signals are all fed forward. In one embodiment, none of the output signals is causally dependent on itself by being fed back.

In embodiments, the mapping devices are concatenated with one another such that no feedback loop is formed such that a state change of at least one output signal of a mapping device is fed as a state change of at least one input signal to another mapping device. In principle, feedback paths may be provided, but the feedback paths do not lead to oscillations. In principle, the output of a mapping device or an output signal may be used as an input signal for a mapping device present upstream in the signal path.

The number of the n input signals of a respective mapping device may correspond to the number p of output signals. However, n may not to be equal to p (e.g., for the states of the input signals to be mapped onto states of output signals with the aid of a respective mapping device). The number of output signals is less than or greater than the number of input signals for a respective mapping device.

The mapping devices may be logic or combinatorial gates that realize, for example, a bijective mapping of n input signals onto n output signals. The input signals fluctuate between levels that may be assigned to logical states, such as bits 1 or high or 0 or low. A bijective mapping may be a one-to-one mapping between the $2^n$ possible logical values of the input signals and the $2^n$ logical values of the output signals.

In embodiments of the apparatus, at least one combinatorial mapping is configured such that the input signals are mapped onto the output signals with application of a jitter and a logical function. As a result of the hardware implementation of the combinatorial mapping by the mapping devices, jitter (e.g., fluctuations) may arise in the temporal profile of signal edges. The jitter is then in each case continued by the performance of the logical function (e.g., of the mapping of the combination of n input signals or bit values onto p output signals or bit values) and accumulates over the passes through the mapping devices.

In this respect, in embodiments of the apparatus, a limited chain of mapping devices arises. The mapping devices may also be designated as nodes or gates. At least one of the combinatorial mappings is designed, for example, such that on average in the case of a state change of an input signal, a state change takes place at more than one output signal. This has the effect that respective jitter of the input signal is mapped onto a plurality of output signals and is therefore amplified. Once jitter has occurred in a signal, the jitter is copied onto a plurality of output traces with the aid of the mapping devices or the combinatorial mappings implemented therein, such that jitter components may scarcely compensate for one another.

In embodiments, provision is made of at least one selected mapping device, the output signals of which are decoupled from all input signals of the remaining mapping devices. By way of example, this may be the last mapping device of a chain of m mapping devices that are linearly coupled to one another. For example, a finite signal profile arises. This may be that, exclusively in a predefined time interval, a signal or a state change of a signal propagates through the concatenated mapping devices. This is because, from a first input mapping device, one random signal propagates along the concatenated mapping devices progressively with jitter and random contributions, or a plurality propagate in accordance with the respective bit width of the mapping devices. Decoupling may be that the output signals are not passed to inputs of other mapping devices.

Further circuits, such as logic gates or delay elements, may be provided in such a signal path from a first to a last mapping device, which may be designated as output mapping.

In one embodiment, at least some of the mappings are not combinatorial mappings that yield exclusively a permutation of the input signals onto the output signals. A permutation of the input signals is present, for example, if the output signals correspond to the input signals or arise from the input signals merely as a result of a change in the order. No "reproduction" of the jitter arises in the case of a permutation.

In embodiments of the apparatus for generating random bits, the mapping devices are configured such that the signal transient times thereof are the same. Signal transient times that are as far as possible the same reduce the risk that jitter contributions may mutually compensate for one another. An implementation in the manner of ASICs or FPGAs is facilitated. By way of example, the mapping devices are configured such that all possible state changes at the respective outputs all take place within a tolerance interval of 100 ps (e.g., within 50 ps).

In embodiments of the apparatus, at least one mapping device includes a look-up table for implementing the combinatorial mapping. In one embodiment, all the mapping devices may be provided with one or a plurality of respective look-up tables. Look-up tables may be read in a simple manner and require only a low hardware outlay. Corresponding fields or tables may be provided in programmable logic chips, such as FPGAs.

In embodiments of the apparatus, the look-up tables may be filled with random bit values using random elements. It is possible, for example, to generate the look-up tables that yield a corresponding output bit pattern at outputs depending on an input bit pattern at inputs of the mapping devices, such that the mapping represented by the look-up table is selected randomly from all $(2^n)!$ bijections of n logical signals onto n logical signals. In one embodiment, in each case, different combinatorial mappings are implemented in the mapping devices.

In embodiments of the apparatus, fixed levels may be applied to the inputs of one of the mapping devices (e.g., the first mapping device of the chain) in order to start from a well-defined state. At least one of the fixed levels is then changed over to another fixed value. Afterward, a random bit signal having a width of n or p bits arises as a result of the concatenated application of the combinatorial mappings to the signals.

In one embodiment, the predefined number n and/or p of input and/or output signals, respectively, is at least three. In embodiments, the bit width or the number n and/or p of predefined input and/or output signals, respectively, at the mapping devices is four or more.

In one embodiment, the number of mapping devices in the chain is at least 25. In embodiments, however, between 20 and 1000 concatenated mapping devices are also provided.

In embodiments of the apparatus, a detection device for detecting one or a plurality of output signals at outputs of a mapping device is provided. The detection device may also detect input or output signals at different mapping devices. Detection takes place, for example, by sampling (e.g., in a clocked manner or at predefined other points in time) and serves for deriving a bit value H or L that has high entropy or randomness on account of the greatly fluctuating random signal.

In one embodiment, a "random run" may be generated periodically by virtue of the fact that defined input signal levels are applied to a first input mapping device. The levels perform a controlled state change, and after the passage of this signal or the resulting signal edge(s) through all the mapping devices, the output signals present or one of the output signals are/is detected at an end or output mapping device. Within the signal profile manifesting jitter and random chunks, sampling may be effected, or a buffer storage element detects the temporally unpredictable state changes. In one embodiment, a counter device may be applied to the outputs (e.g., of the last output mapping device, which counts signal edges). The resulting bit value or values may be a random bit.

In embodiments, the detection device includes at least one buffer storage element. The buffer storage element may include a flip-flop, such as a T flip-flop, for example, or a latch device. One or a plurality of counters for detecting signal edges or state changes of individual signals may also be provided. A T flip-flop is suitable for counting rising or falling signal edges modulo 2.

The detection device is configured, for example, to sample one output signal depending on another output signal. For example, a signal edge of a first output signal may trigger or bring about the sampling of another output signal.

In embodiments, the detection device is configured to detect a temporal order of state changes of output signals. In order to derive a random bit value, for example, the order of detected signal state changes is determined at a selection of outputs or in output signals. A random bit value is then determined or defined depending on the order.

In embodiments, the apparatus is part of an FPGA device or an ASIC device.

A method for generating random bits is proposed. A plurality of combinatorial mappings are carried out successively in a concatenated manner. In this case, a respective combinatorial mapping maps a predefined number n of input signals onto a predefined number p of output signals. At least one combinatorial mapping is chosen such that a state change of an input signal is mapped by the combinatorial mappings on average onto more than one output signal. In this case, no feedback loop is generated such that a state change of at least one feedback output signal of a specific combinatorial mapping is fed as a state change of at least one input signal for another combinatorial mapping such that one or a plurality of output signals of the specific mapping is influenced by the state change of the feedback output signal.

A respective input signal may represent a bit value, for example. The combinatorial mappings may be designated as n to p mappings.

In the method, the combinatorial mappings may be concatenated with one another such that no feedback loop arises. For example, feedbacks in which a state change of at least one output signal of one mapping device is fed as a state change of at least one input signal to another mapping device (e.g., present upstream in the signal path in the chain) are avoided. In one embodiment, combinatorial mappings are concatenated only forwards, or the mapping devices are connected in series in succession and are operated without feedback.

The method may be implemented, for example, using suitable description languages (e.g., VHDL or Verilog) on or in an FPGA or ASIC apparatus. In the FPGA apparatus and/or the method, the mapping devices may be designed such that state changes at an input signal of the n input signals, depending on the combinatorial mapping at an identical point in time, bring about a state change in one or a plurality of the p output signals, as far as possible, simultaneously.

Further implementations also include combinations (e.g., not explicitly mentioned) of apparatuses or method variants described above or below with regard to the exemplary embodiments. In this case, a person skilled in the art will also add or modify individual aspects as improvements or supplementations with regard to the respective basic form of the invention.

BRIEF DESCRIPTION OF THE DRAWINGS

FIGS. 2A-2C, 3A-3B, and 4A-4D show exemplary temporal profiles of random bit signals that are generated in accordance with exemplary embodiments of the method and of the apparatus for generating random bits;

FIG. 5 shows an exemplary temporal profile of the current consumption of one embodiment of the apparatus for generating random bits.

DETAILED DESCRIPTION

In the figures, functionally same elements are provided with the same reference signs, unless indicated otherwise.

Figure 1:
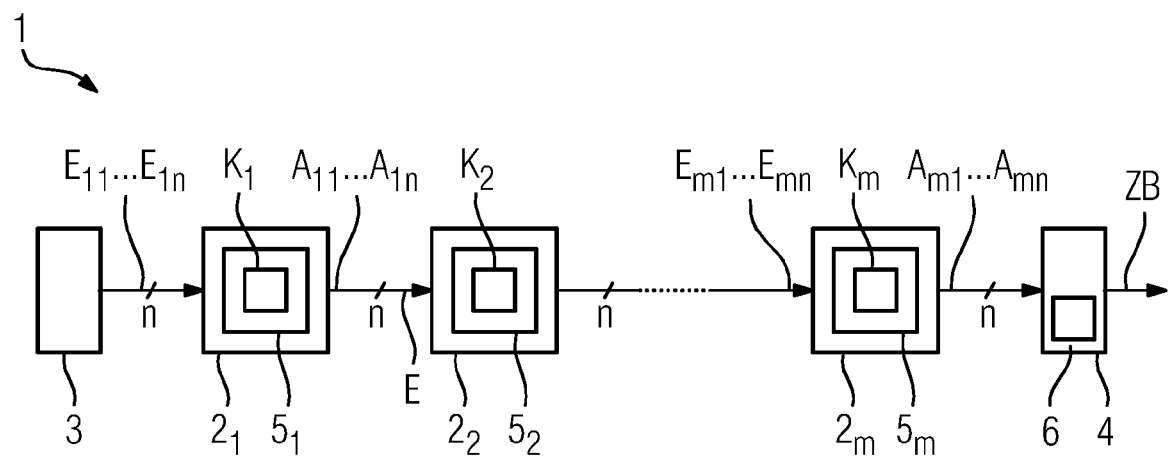
FIG. 1 shows a schematic illustration of a first exemplary embodiment of an apparatus for generating random bits.

FIG. 1 shows a schematic illustration of a first exemplary embodiment of an apparatus for generating random bits. The apparatus 1 is configured in the manner of a chain of mapping devices $2_1$-$2_m$. For this purpose, combinatorial digital circuits $2_1$-$2_m$ are coupled in series or in succession. The combinatorial digital circuits $2_1$-$2_m$ may also be understood as logic gates or mapping devices for a respective combinatorial mapping $K_1$-$K_m$.

A start device 3 is also provided. The start device 3 provides defined values for the input signals $E_{i1}$-$E_{in}$ for the first mapping device $2_1$. A detection or sampling device 4 is coupled to the last output mapping device $2_m$ of the chain, and detects the output signals $A_{m1}$-$A_{mn}$, of the last mapping device $2_m$. By way of example, latches or flip-flops 6 are used for this purpose. The latches or flip-flops 6 detect signal edges within the random signal profile. From the detected levels, a random bit or a random number ZB may be derived. The random bit or the random number ZB may be output by the sampling device 4. In FIG. 1, n=p.

Each mapping device $2_i$ has n inputs for an n bit wide input signal $E_{ij}$, where j=1 . . . n, and p outputs for a p bit wide output signal $A_{ij}$, where j=1 . . . p. The inputs and outputs are not explicitly indicated in FIG. 1. A respective mapping device $2_i$ in this regard receives $E_{i1}$-$E_{in}$, input signals and outputs $A_{i1}$-$A_{ip}$, output signals. The combination between input and output signals is realized via a combinatorial mapping $K_i$. In the illustration in FIG. 1, in which n=p, $K_1$ to $K_m$ combinatorial mappings are effected in a concatenated manner in succession.

During the operation of the apparatus for generating random bits 1, signals subjected to jitter propagate from the first input mapping device $2_1$ to the output mapping device $2_m$. The mapping devices $2_1$-$2_m$ are implemented as combinatorial mappings $K_1$-$K_m$ such that on average a state change of the signal $E_{k1}$-$E_{kn}$ present at a respective input leads to a state change in more than one of the output signals $A_{k1}$-$A_{kn}$. In other words, an alteration of a respective input bit or of a logical state of an input signal $E_{kj}$ leads on average to changes in more than one of the output bits of the respective node or of the respective mapping device. In this regard, jitter present in the signals $E_{11}$ to $E_{mn}$ and/or $A_{11}$ to $A_{m-1,n}$ accumulates and is reproduced upon passing through the concatenated mapping devices $2_1$ to $2_m$. The longer the signal path (e.g., the more concatenated series-interconnected mapping devices $2_1$-$2_m$ are present), the more greatly any jitter that is present is amplified and copied to the n or p different channels.

Although illustrated in this way for the sake of simplicity in FIG. 1, the mapping devices $2_1$-$2_m$ may not have the same number n of inputs and outputs. The bit width can vary in FIG. 1 in the course of the signal path from the start device 3 to the sampling device 6. By way of example, m=100 mapping devices are coupled successively. The mapping devices may implement the respective combinatorial mapping $K_1$ to $K_n$, in the manner of look-up tables $5_1$-$5_m$.

The respective signal transient time in a mapping device or a logic or combinatorial gate $2_i$ is substantially the same for all input signals $E_{i1}$ to $E_{in}$, such that on account of the combinatorial mapping $K_i$ implemented, the change of a logical state at an input signal $E_{ij}$ is substantially simultaneous with logical changes at one or a plurality of output signals $A_{il}$, where l=1 . . . n. In this regard, this results in n channels with random signal waveforms that are brought about by the jitter brought about by the switching elements that construct the digital mapping devices.

The schematically indicated apparatus for generating random bits 1 may be realized, for example, in terms of outlay in field-programmable gate array (FPGA) or application specific integrated circuit (ASIC) devices. Compared with conventional ring oscillators, random bits may be generated with a higher data rate since, for example, the jitter that fosters random chance is reproduced potentially n-fold with the aid of the plurality of channels. By virtue of the large number of channels and mappings, it is unlikely that jitter contributions will compensate for one another. In this regard, a random number generator having a high random bit generating frequency may be realized expediently in terms of outlay.

On account of the linear topology and finite number of combinatorial mappings or mapping devices $2_1$-$2_m$, a signal edge or an input signal change passes through a limited number of logic gates with application of jitter and application of the combinatorial mappings. Accordingly, the number of changeover processes during the passage of a signal edge or signal change from the start device 3 to the sampling device 6 is also finite. This results in a particularly low current consumption, such that the proposed apparatus is suitable, for example, for use in mobile applications (e.g., on smart cards).

In one embodiment, at least 20 mapping devices are provided in a manner concatenated with one another. In embodiments, however, 50 or 100 mappings may also be provided. In one embodiment, the number of mappings or mapping devices concatenated with one another is between 50 and 100. In particular embodiments, the number is between 100 and 1000 mapping devices.

Examples of random number generators in which the number of input signals is n=4, and the number of output signals is likewise n=p=4, are considered below.

For 25 mappings or mapping devices concatenated in succession, random bit states arise at the outputs of the last mapping device in the chain.

The following table illustrates an exemplary combinatorial mapping $K_q$ that maps n=4 input states or input signals $E_{q1}$-$E_{q4}$ onto p=4 output states or output signals $A_{q1}$-$A_{q4}$. In order to simplify the illustration, it is assumed that the input signals $E_{q1}$-$E_{q4}$ and the output signals $A_{q1}$-$A_{q4}$ represent logical states 0 or 1 or L or H, even though the "randomization" and high degree of application of random jitter provide that it is more likely that no well-defined logical levels are present in the apparatus for generating random bits, which is implemented as hardware or as a circuit.

| $E_{q4}$ | $E_{q3}$ | $E_{q2}$ | $E_{q1}$ | $A_{q4}$ | $A_{q3}$ | $A_{q2}$ | $A_{q1}$ |
|---|---|---|---|---|---|---|---|
| 0 | 0 | 0 | 0 | 0 | 1 | 0 | 0 |
| 0 | 0 | 0 | 1 | 1 | 0 | 0 | 1 |
| 0 | 0 | 1 | 0 | 0 | 0 | 1 | 1 |
| 0 | 0 | 1 | 1 | 1 | 1 | 1 | 0 |
| 0 | 1 | 0 | 0 | 1 | 1 | 1 | 1 |
| 0 | 1 | 0 | 1 | 0 | 0 | 0 | 1 |
| 0 | 1 | 1 | 0 | 1 | 0 | 0 | 0 |
| 0 | 1 | 1 | 1 | 0 | 1 | 1 | 1 |
| 1 | 0 | 0 | 0 | 1 | 0 | 1 | 1 |
| 1 | 0 | 0 | 1 | 0 | 1 | 1 | 0 |
| 1 | 0 | 1 | 0 | 1 | 1 | 0 | 0 |
| 1 | 0 | 1 | 1 | 1 | 0 | 0 | 1 |
| 1 | 1 | 0 | 0 | 0 | 0 | 1 | 0 |
| 1 | 1 | 0 | 1 | 1 | 1 | 0 | 1 |
| 1 | 1 | 1 | 0 | 0 | 0 | 0 | 0 |
| 1 | 1 | 1 | 1 | 1 | 0 | 1 | 0 |

The table may be implemented as a look-up table for forming the mapping device $2_q$. In this case, a bijective mapping is realized, such that every possible bit pattern including four input bits or input signal states $E_{q1}$, $E_{q2}$, $E_{q3}$, $E_{q4}$ occurs exactly once at the outputs of the mapping device $2_q$ as output signal states $A_{q1}$, $A_{q2}$, $A_{q3}$, $A_{q4}$.

For the case where the input signals $E_{q1}$, $E_{q2}$, $E_{q3}$, $E_{q4}$ initially form a bit pattern 0000, which is mapped onto output signals 0100 according to row 1 of the table, and the input signal $E_{q1}$ performs a state change, 1001 arises as an output bit pattern in accordance with the second row of the table above. In other words, the state change of the input signal $E_{q1}$ from 0 to 1 is "reproduced" with the aid of the combinatorial mapping $K_q$ onto the three output signals $A_{q1}$, $A_{q3}$ and $A_{q4}$. On account of the state change of $E_{q1}$, the output signal $A_{q1}$ changes from 0 to 1, the output signal $A_{q3}$ changes from 1 to 0, and the output signal $A_{q4}$ changes from 0 to 1.

An input bit pattern of 0010 leads to an output bit pattern 0011 (cf., third row of the table). Proceeding from a bit pattern 0000 and a state change of the input signal $E_{q2}$ from 0 to 1, state changes therefore arise in the three output signals $A_{q1}$, $A_{q2}$ and $A_{q3}$, even though only one input-side state change took place in the input signal $E_{q2}$.

Analogously, for input bit patterns 0100 and 1000 proceeding from 0000, three or all four output states change. Investigations concerning all possible state changes of individual input signals proceeding from all 16 input bit patterns have revealed that in the case of the illustrated mapping $K_q$, on average, a state change of an input signal $E_{qi}$ leads to 2.75 state changes in output signals, for example.

In the implementation of the combinatorial mappings as electronic circuits, the signal edges that correspond to the state changes are subjected to further jitter and "copied" onto a plurality (e.g., 2.75) of output signals. For example, an input signal that manifests jitter is converted or mapped into a plurality of output signals that manifest jitter. Additional jitter is supplemented by the respective mapping itself. The jitter, used as a phenomenon imparting random chance, is thus amplified and distributed among a plurality of channels.

The combinatorial mapping $K_q$ reproduced as an example in tabular form, may be represented equivalently in the form of Boolean functions.

When written as a disjunctive normal form, the combinatorial mapping $K_q$ reads:

$A_{q4}=$
OR[AND($E_{q4}$,$E_{q3}$,$E_{q1}$),
AND($E_{q4}$,NOT[$E_{q3}$],NOT[$E_{q1}$]),
AND(NOT[$E_{q4}$],$E_{q3}$,NOT[$E_{q1}$]),
AND(NOT[$E_{q4}$],NOT[$E_{q3}$],$E_{q1}$)]
$A_{q3}=$
OR[AND($E_{q4}$,NOT[$E_{q3}$],$E_{q2}$),
AND($E_{q4}$,NOT[$E_{q2}$],$E_{q1}$),
AND(NOT[$E_{q4}$],$E_{q2}$,$E_{q1}$),
AND(NOT[$E_{q4}$],NOT[$E_{q2}$],NOT[$E_{q1}$])]
$A_{q2}=$
OR[AND($E_{q4}$,NOT[$E_{q3}$],NOT[$E_{q2}$]),
AND(NOT[$E_{q4}$],NOT[$E_{q3}$],$E_{q2}$),
AND($E_{q3}$,$E_{q2}$,$E_{q1}$),
AND($E_{q3}$,NOT[$E_{q2}$],NOT[$E_{q1}$])]
$A_{q1}=$
OR[AND($E_{q4}$,NOT($E_{q3}$),$E_{q2}$,$E_{q1}$),
AND($E_{q4}$,NOT[$E_{q3}$],NOT[$E_{q2}$],NOT[$E_{q1}$]),
AND(NOT[$E_{q4}$],$E_{q3}$,NOT[$E_{q2}$]),
AND(NOT[$E_{q4}$],$E_{q3}$, $E_{q1}$),
AND(NOT[$E_{q4}$],NOT[$E_{q3}$],$E_{q2}$,NOT[$E_{q1}$]),
AND(NOT[$E_{q4}$],NOT[$E_{q2}$],$E_{q1}$),
AND($E_{q3}$,NOT[$E_{q2}$],$E_{q1}$)]

In this case, OR stands for a logical OR combination, AND stands for a logical AND combination and NOT stands for a logical NOT combination. For the hardware implementation, instead of a look-up table, the combinatorial mappings may also be realized as a combination of logic gates in accordance with the above representation. The disjunctive normal form representation may also be rewritten to an algebraic normal form, which may likewise be used for the design of corresponding logic circuits. The following may be written:

$A_{q4}=$XOR[$E_{q1}$,$E_{q3}$,$E_{q4}$]
$A_{q3}=$NOT[XOR($E_{q1}$,$E_{q2}$,$E_{q4}$,AND[$E_{q4}$,$E_{q2}$,$E_{q1}$],AND[$E_{q4}$,$E_{q3}$,$E_{q2}$])]
$A_{q2}=$XOR[$E_{q2}$,$E_{q3}$,$E_{q4}$,AND($E_{q3}$,$E_{q1}$),AND($E_{q4}$,$E_{q3}$)]
$A_{q1}=$XOR[$E_{q1}$,$E_{q2}$,$E_{q3}$,$E_{q4}$,AND($E_{q3}$,$E_{q1}$),AND($E_{q3}$,$E_{q2}$,$E_{q1}$),
AND($E_{q4}$,$E_{q3}$,$E_{q1}$),AND($E_{q4}$,$E_{q3}$,$E_{q2}$)]

It is evident in both representations that the output signal $A_{q4}$ is independent of a state change of the input signal $E_{q2}$. A design of the combinatorial mappings $K_q$ that is optimized even further provides for a respective output signal to be dependent on as many input signals as possible. Each output signal of a combinatorial mapping may be dependent on all input signals for the mapping. Jitter in the signals would then be multiplied and amplified particularly well.

Favorable random signal levels are present at the outputs of the last mapping device in the chain, even if identical initial states are predefined by the start device 3, and a respective state change of the initial states of the input signals $E_{11}$-$E_{1n}$ is initiated for starting the apparatus. The random signal profiles $A_{m1}$-$A_{mn}$ detected with the aid of the sampling or detection device 4 may be sampled, for example, during a corresponding "pass" at the detection device 4.

FIGS. 2 and 3 show profiles of exemplary random bit signals generated by an FPGA implementation of the circuit indicated schematically in FIG. 1. In this case, m=1000 logic gates or mapping devices are concatenated with one another. The combinatorial mappings have been fixed as four to four mappings. In other words, four input signals are mapped onto four output signals.

The respective signal level of the output signals $A_{1000,1}$-$A_{1000,4}$ is represented on the Y-axis. The time in nanoseconds is plotted on the X-axis. In this case, FIG. 2A, FIG. 2B and FIG. 2C each show the signal profiles for various runs or starts in which the signal levels of the input signals $E_{11}$-$E_{14}$ were changed from 0 to 1 with the aid of a start device 3. After passing through the 1000 logic gates or mapping devices $2_1$-$2_{1000}$, a practically random signal waveform is tapped off at the outputs of the last mapping device. In this case, the curve c1 represents the output signal $A_{1000,1}$, the curve c2 represents the output signal $A_{1000,2}$, the curve c3 represents the output signal $A_{1000,3}$ and the curve c4 represents the output signal $A_{1000,4}$.

Approximately 650 to 670 ns, for example, are required for the passage or propagation. A small fluctuation may arise as a result of different transient times through the mappings or gates. The signals $A_{1000,1}$ in FIGS. 2A, 2B and 2C have a totally different form. The same applies to the output signals $A_{1000,2}$, $A_{1000,3}$ and $A_{1000,4}$. By way of example, the respective signal may be fed to a T flip-flop, which detects the signal edges modulo 2. The resulting output bit value of a corresponding T flip-flop may be regarded as a random bit ZB.

FIGS. 3A and 3B again show the output signal waveforms c1, c2, c3 and c4 for two passes or runs of a random bit generator having a length of 1000 gates. FIGS. 3A and 3B correspond to excerpt illustrations of the signal profiles between approximately 630 and 830 ns. The signal waveforms from FIG. 3A differ from the signal waveforms in FIG. 3B. Different random bit signals thus arise.

FIGS. 4A, 4B, 4C, 4D show corresponding signal waveforms for a random number generator having a length of 100 gates in an FPGA implementation. In this regard, the signal profiles of the output signals $A_{100,1}$ (curve c1), $A_{100,2}$ (curve 2), $A_{100,3}$ (curve c3) and $A_{100,4}$ (curve c4) are represented as a function of time. An excerpt of 100 ns is illustrated. The signal change takes place earlier in comparison with the signal change in FIGS. 3A, 3B, 3C, owing to the shorter total signal transient time.

FIGS. 4A, 4B, 4C, 4D show that after approximately 62 ns, the signal waveforms are present at the end or at the output mapping device $2_{100}$. In the case of 100 nodes, the combinatorial mappings $K_1$ to $K_{100}$ used may be realized, for example, with the aid of 400 look-up tables.

FIG. 5 illustrates exemplary current consumption of a random bit generator with 100 combinatorial mappings with four traces. The chain of 100 mapping devices was realized based on an FPGA chip. The combinatorial mappings were realized with the aid of look-up tables. FIG. 5 shows the measurement of the voltage dropped across a resistance of the power supply of the FPGA board. The resistance has a magnitude of 1 ohm, as a function of time.

25 circuits were implemented simultaneously, such that the voltage dropped across the resistance R=1Ω applies to 25 random bit generators. More than 70,000 random bit generations were carried out and averaged over the voltage drop.

FIG. 5 shows the voltage drop in millivolts across a 1 ohm resistance as a function of time, which is indicated in μs.

As shown in FIG. 4, after 75 ns, a signal has propagated through the 100 logic gates or mappings. However, in order to include further effects, the average current consumption was determined by integration over 300 ns. If the power consumption is related to approximately 75 ns, which would be necessary for the actual generation of random bits, a current consumption of approximately 1.2 mA would result. At an operating voltage of the FPGA board of 1.2 V, this results in a power consumption of $10^{-10}$ Ws per random bit or random bit pattern generation given a bit width of n=4. In comparison with conventional ring oscillators, this is a lower current since, in the case of ring oscillators, a settling time during which the ring oscillator performs many oscillations and uses a large amount of power on account of the many signal changes is to be taken account of. In this regard, an extremely energy-efficient method and apparatus for generating random bits are provided.

The random bits may be generated at a high rate since a settling time is not necessary. Rather, an upper limit of the random bit generation rate is the transient time through the concatenated mappings or mapping devices or logic gates. In the case of the above-described example with 100 logical or combinatorial mappings concatenated in succession, a renewed random bit generation may take place after 75-80 ns.

Figure 6:
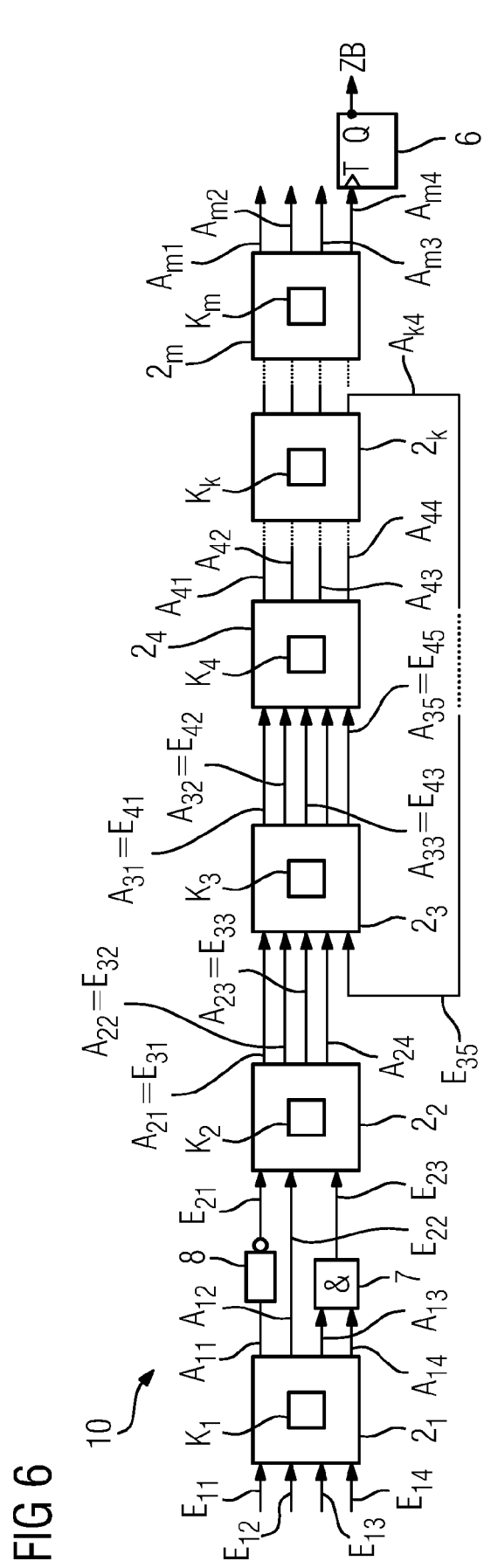
FIG. 6 shows a schematic illustration of a further exemplary embodiment of an apparatus for generating random bits.

FIG. 6 shows a schematic illustration of a further exemplary embodiment of an apparatus for generating random bits. The apparatus 10 implements some optional modifications with regard to the apparatus 1 illustrated in FIG. 1. FIG. 6 shows m series-connected mapping devices $2_1$ to $2_m$ that respectively implement combinatorial mappings $K_1$-$K_m$. In this case, the bit width of the mappings is not constant. By way of example, the mapping devices $2_1$ and $2_k$-$2_m$ are implemented as combinatorial mappings that map four input signals onto four output signals.

The combinatorial mapping $K_2$ implemented in the mapping device $2_2$ maps three input signals $E_{21}, E_{22}, E_{23}$ onto four output signals $A_{21}, A_{22}, A_{23}, A_{24}$. The combinatorial mapping $K_3$ implemented in the third mapping device $2_3$ maps five input signals onto five output signals. The fourth combinatorial mapping $K_4$ implemented with the aid of the mapping device $2_4$ maps five input signals onto four output signals.

The output signal $A_{11}$ is inverted with the aid of an inverter 8 into an input signal $E_{21}$ for the second mapping device $2_2$. The two output signals $A_{13}$ and $A_{14}$ of the first mapping device $2_1$ are ANDed together with the aid of a logic gate 7 and fed as input signal $E_{23}$ to the second mapping device $2_2$.

In principle, it is advantageous if exclusively feedforward signal paths arise. However, it is harmless if feedback paths occur, in which a state change of an output signal (e.g., of the output signal $A_{k4}$) is fed back as input signal $E_{35}$, but the combinatorial mapping $K_3$ does not react to a state change of the input signal $E_{35}$, or no reproduction to other output signals $A_{31}$ to $A_{35}$ arises. In the random bit generating apparatuses, no feedback loop is formed such that a state change of at least one output signal of one mapping device is fed as a state change of at least one input signal to another mapping device (e.g., upstream in the signal path). Such feedbacks in which a state change of a fed-back output signal of a specific mapping device $2_k$ is fed as a state change of at least one input signal $E_{35}$ to another mapping device $2_3$ such that one or a plurality of output signals $A_{k1}$-$A_{k4}$ of the specific mapping device $2_k$ is/are influenced by the state change of the fed-back output signal $A_{k4}$ may be excluded. None of the output signals is dependent on itself.

The output signal $A_{m4}$ is fed to a toggle flip-flop 6. The toggle flip-flop 6 counts the rising signal edges as 0 to 1 passes modulo 2. A respective random bit may then be tapped off at the data output Q of the flip-flop 6.

The proposed apparatus and the underlying method are suitable, for example, for implementation in ASICs. The logical functions of the mapping devices may have the same logical depth in order to obtain an identical signal transient time of the combinatorial mappings. Look-up tables may also be dispensed with in this regard. One or more of the present embodiments therefore make fast random bit generation in conjunction with little hardware outlay possible.

Although the present embodiments have been specifically illustrated and described in detail, the invention is not restricted by the examples disclosed. Other variations may be derived therefrom by a person skilled in the art, without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An apparatus for generating random bits, the apparatus comprising:
   a plurality of mapping devices, wherein a respective mapping device of the plurality of mapping devices is configured to map a predefined number of input signals with the aid of a combinatorial mapping into a predefined number of output signals,
   wherein the plurality of mapping devices are concatenated with one another, and at least one combinatorial mapping is configured such that a state change of an input signal of a respective mapping device of the plurality of mapping devices is mapped on average onto more than one output signal of the respective mapping device, and
   wherein no feedback loop is present such that a state change of at least one feedback output signal of a specific mapping device of the plurality of mapping devices is fed as a state change of at least one input signal to another mapping device of the plurality of mapping devices such that one or a plurality of output signals of the specific mapping device is influenced by the state change of the feedback output signal.

2. The apparatus of claim 1, wherein output signals of a mapping device of the plurality of mapping devices are decoupled from all input signals of the remaining mapping devices of the plurality of mapping devices.

3. The apparatus of claim 1, wherein at least one combinatorial mapping is configured such that the input signals are mapped onto the output signals with application of a jitter and a logical function.

4. The apparatus of claim 1, wherein the combinatorial mappings implement no combinatorial mapping that yields a permutation of the input signals onto the output signals.

5. The apparatus of claim 1, wherein the plurality of mapping devices are configured such that signal transient times of the plurality of mapping devices are the same.

6. The apparatus of claim 1, wherein at least one mapping device of the plurality of mapping devices comprises a look-up table for implementing the combinatorial mapping.

7. The apparatus of claim 1, wherein at least one combinatorial mapping is a bijection.

8. The apparatus of claim 1, wherein each mapping device of the plurality of mapping devices implements a different combinatorial mapping.

9. The apparatus of claim 1, wherein at least one mapping device of the plurality of mapping devices is configured as a logic gate that logically combines a predefined number of input signals to form a predefined number of output signals.

10. The apparatus of claim 1, further comprising a detection device configured for detecting one or a plurality of output signals at outputs of one or different mapping devices of the plurality of mapping devices, wherein the detection device is configured to sample one output signal depending on another output signal.

11. The apparatus of claim 10, wherein the detection device comprises a buffer storage element.

12. The apparatus of claim 11, wherein the buffer storage element comprises a T flipflop.

13. The apparatus of claim 10, wherein the detection device is configured to detect a temporal order of state changes of output signals.

14. The apparatus of claim 1, wherein the apparatus is part of an FPGA device or an ASIC device.

15. The apparatus of claim 2, wherein at least one combinatorial mapping is configured such that the input signals are mapped onto the output signals with application of a jitter and a logical function.

16. The apparatus of claim 15, wherein the combinatorial mappings implement no combinatorial mapping that yields a permutation of the input signals onto the output signals.

17. The apparatus of claim 16, wherein the plurality of mapping devices are configured such that signal transient times of the plurality of mapping devices are the same.

18. The apparatus of claim 17, wherein at least one mapping device of the plurality of mapping devices comprises a look-up table for implementing the combinatorial mapping.

19. A method for generating random bits, the method comprising:
   carrying out a plurality of combinatorial mappings successively in a concatenated fashion, wherein a respective combinatorial mapping of the plurality of combinatorial mappings maps a predefined number of input signals onto a predefined number of output signals, and at least one combinatorial mapping of the plurality of combinatorial mappings is chosen such that a state change of an input signal is mapped by the at least one combinatorial mapping on average onto more than one output signal,
   wherein no feedback loop is generated such that a state change of at least one feedback output signal of a specific combinatorial mapping of the plurality of combinatorial mappings is fed as a state change of at least one input signal for another combinatorial mapping of the plurality of combinatorial mappings such that one or a plurality of output signals of the specific combinatorial mapping is influenced by the state change of the feedback output signal.

20. The method of claim 19, wherein the plurality of combinatorial mappings are concatenated with one another such that no feedback loop, in which a state change of at least one output signal of one mapping device is fed as a state change of at least one input signal to another mapping device that is provided upstream in the signal path, is formed.

* * * * *